(12) United States Patent
Zhang et al.

(10) Patent No.: US 9,746,707 B2
(45) Date of Patent: Aug. 29, 2017

(54) METHOD FOR MANUFACTURING DISPLAY SUBSTRATE, DISPLAY SUBSTRATE AND DISPLAY DEVICE

(71) Applicant: BOE TECHNOLOGY GROUP CO., LTD., Beijing (CN)

(72) Inventors: Feng Zhang, Beijing (CN); Zhanfeng Cao, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/096,412

(22) Filed: Apr. 12, 2016

(65) Prior Publication Data

US 2016/0306225 A1   Oct. 20, 2016

(30) Foreign Application Priority Data

Apr. 14, 2015   (CN) .......................... 2015 1 0176806

(51) Int. Cl.
*H01L 21/00* (2006.01)
*G02F 1/1335* (2006.01)
*H01L 27/12* (2006.01)
*H01L 29/786* (2006.01)
(Continued)

(52) U.S. Cl.
CPC .... *G02F 1/133512* (2013.01); *G02F 1/13439* (2013.01); *G02F 1/133516* (2013.01); *G02F 1/136286* (2013.01); *H01L 27/124* (2013.01); *H01L 27/1225* (2013.01); *H01L 27/1262* (2013.01); *H01L 29/7869* (2013.01); *G02F 1/136209* (2013.01); *G02F 2001/136222* (2013.01); *G02F 2001/136295* (2013.01)

(58) Field of Classification Search
CPC .......... H01L 21/02628; H01L 27/1225; H01L 27/124
USPC ........................................................... 438/29
See application file for complete search history.

(56) References Cited

U.S. PATENT DOCUMENTS 5,561,011 A * 10/1996 Miyazaki .......... G02F 1/133512
430/293
2007/0040974 A1   2/2007 Ninomiya et al.
(Continued)

FOREIGN PATENT DOCUMENTS

CN         102508376 A      6/2012
CN         104218160 A     12/2014
(Continued)

OTHER PUBLICATIONS

First Office Action regarding Chinese Application No. 201510176806.0, dated Mar. 13, 2017. Translation provided by Dragon Intellectual Property Law Firm.

*Primary Examiner* — David S Blum
(74) *Attorney, Agent, or Firm* — Harness, Dickey & Pierce, P.L.C.

(57) ABSTRACT

The present disclosure provides a method for manufacturing a display substrate, the display substrate and a display device. The method includes a step of forming a black matrix. The step of forming the black matrix includes: forming a metal pattern for the black matrix, the metal pattern being made of an amphoteric metal or an amphoteric metal alloy; and treating the metal pattern with an alkaline solution, so as to form the black matrix wherein a surface of black matrix has a concave-convex microstructure.

10 Claims, 6 Drawing Sheets

(51) Int. Cl.
  *G02F 1/1343* (2006.01)
  *G02F 1/1362* (2006.01)

(56) References Cited

U.S. PATENT DOCUMENTS

2011/0096273 A1* 4/2011 Shimizu .................. G02B 5/201
  349/106
2015/0344778 A1* 12/2015 Kuriyama .............. C09K 19/20
  349/106

FOREIGN PATENT DOCUMENTS

| | | |
|---|---|---|
| JP | 2008233463 A | 10/2008 |
| JP | 2010091670 A | 4/2010 |

* cited by examiner

Forming a Metal Pattern for a Black Matrix, the Metal Pattern Being Made Of an Amphoteric Metal or an Amphoteric Metal Alloy ⟶ 51

Treating the Metal Pattern with an Alkaline Solution, So As To Form the Black Matrix ⟶ 52

Fig.10

METHOD FOR MANUFACTURING DISPLAY SUBSTRATE, DISPLAY SUBSTRATE AND DISPLAY DEVICE

CROSS-REFERENCE TO RELATED APPLICATION

The present application claims a priority of the Chinese Patent Application No. 201510176806.0 filed on Apr. 14, 2015, which is incorporated herein by reference in its entirety.

TECHNICAL FIELD

The present disclosure relates to the field of liquid crystal display technology, in particular to a method for manufacturing a display substrate, the display substrate, and a display device.

BACKGROUND

Liquid crystal displays (LCDs) and organic light-emitting diode (OLED) display devices have been widely used in our daily lives, and resolution, gamut and brightness of the display devices are increasingly demanded. Recently, such products with 500 pixel per inch (PPI), and even 600 PPI have been developed.

For a conventional LCD, an array substrate and a color filter substrate are arranged opposite to each other to form a cell, and during the cell formation, patterns on the array substrate may be offset from the corresponding patterns on the color filter substrate. This offset may result in a decrease in an aperture ratio as well as light leakage. In addition, the larger the PPI of the LCD, the smaller the aperture ratio, the smaller the brightness and the gamut, and the higher the power consumption.

In order to eliminate the offset between the array substrate and the color filter substrate, increase the aperture ratio and reduce the production cost, such a technology where a color filter and a black matrix are arranged on the array substrate, i.e., Color Filter On Array (COA), has been developed. To be specific, the black matrix is arranged on a data line, a gate line and a thin film transistor (TFT) of the array substrate, so as to reduce the offset between the patterns on the array substrate and the corresponding patterns on the color filter substrate during the cell formation, thereby to increase the aperture ratio, reduce the production cost and improve the image quality.

However, when the black matrix is made of a metal material, light may be reflected by the black matrix. As a result, a contrast will be degraded and the image quality will be adversely affected.

SUMMARY

An object of the present disclosure is to provide a method for manufacturing a display substrate, the display substrate, and a display device, so as to provide a metal black matrix, a surface of which has a concave-convex microstructure, and reduce reflectivity of the black matrix, thereby to reduce reflectivity of a display panel with respect to an ambient light beam, increase the contrast and improve the image quality.

In one aspect, the present disclosure provides in some embodiments a method for manufacturing a display substrate, including a step of forming a black matrix. The step of forming the black matrix includes: forming a metal pattern for the black matrix, the metal pattern being made of an amphoteric metal or an amphoteric metal alloy; and treating the metal pattern with an alkaline solution, so as to form the black matrix, wherein a surface of the black matrix has a concave-convex microstructure.

Alternatively, the amphoteric metal is aluminium, zinc or beryllium.

Alternatively, the alkaline solution is tetramethylammonium hydroxide (TMAH) or potassium hydroxide (KOH) solution at a concentration of 0.01% to 5%.

Alternatively, the alkaline solution is a KOH solution at a concentration of 0.04%.

Alternatively, subsequent to the step of forming the metal pattern for the black matrix, the method further includes: forming a first layer on the metal pattern, a first photoresist on which has not been removed; removing the first photoresist, so as to remove a portion of the first layer on the first photoresist; and applying a second photoresist on the remaining portion of the first layer, and exposing the second photoresist. The step of treating the metal pattern with the alkaline solution so as to form the black matrix includes treating the metal pattern with an alkaline developing solution for developing the exposed second photoresist, so as to form the black matrix, wherein a surface of the black matrix has a concave-convex microstructure.

Alternatively, the display substrate is a COA substrate.

Alternatively, the first layer is a transparent conductive layer for forming a pixel electrode or a common electrode.

Alternatively, the first layer is made of indium tin oxide (ITO) or indium zinc oxide (IZO).

Alternatively, the method further includes: forming a pattern of a gate metal layer including a gate electrode and a gate line; forming a gate insulation layer on the gate metal layer; forming an active layer, a data line, a source electrode and a drain electrode sequentially on the gate insulation layer; forming a first passivation layer covering the active layer, the data line, the source electrode and the drain electrode; forming a color filter; subjecting the color filter to planarization treatment with an organic film, and forming a pattern of the organic film through a patterning process; depositing a transparent conductive film and forming a pattern of the common electrode through a patterning process; depositing a second passivation layer, and forming a pattern of the second passivation layer through a patterning process; and depositing an ITO or IZO layer on the second passivation layer by magnetron sputtering, and forming a pattern of the pixel electrode through a patterning process.

Alternatively, the step of forming the black matrix is performed subsequent to the step of depositing the transparent conductive film and forming the pattern of the common electrode through a patterning process, and prior to the step of depositing the second passivation layer, or the step of forming the black matrix is performed subsequent to the step of forming the pattern of the pixel electrode.

In another aspect, the present disclosure provides in some embodiments the display substrate manufactured by the above-mentioned method. The display substrate comprising a black matrix and a surface of the black matrix has a concave-convex microstructure.

In yet another aspect, the present disclosure provides in some embodiments a display device including the above-mentioned display substrate.

According to the embodiments of the present disclosure, the black matrix is made of an amphoteric metal or amphoteric metal alloy, and then a surface of the metal black matrix is treated with the alkaline solution. Due to the reaction of the amphoteric metal with the alkaline solution, the surface of the metal black matrix may be corroded, so as to change the smooth surface with high reflectivity into the rough surface and reduce the reflectivity of the black matrix. As a result, it is able to reduce the reflectivity of the display panel with respect to the ambient light beam, thereby to increase the contrast and improve the image quality.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
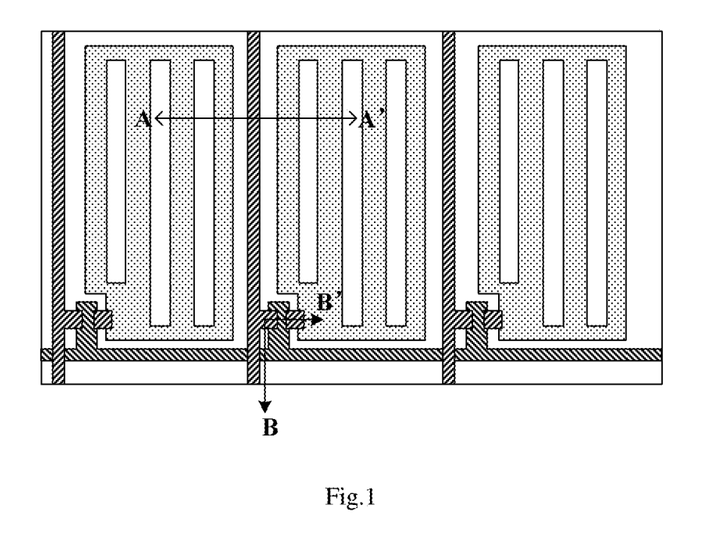
FIG. 1 is a top view of a COA array substrate.
Figure 2:
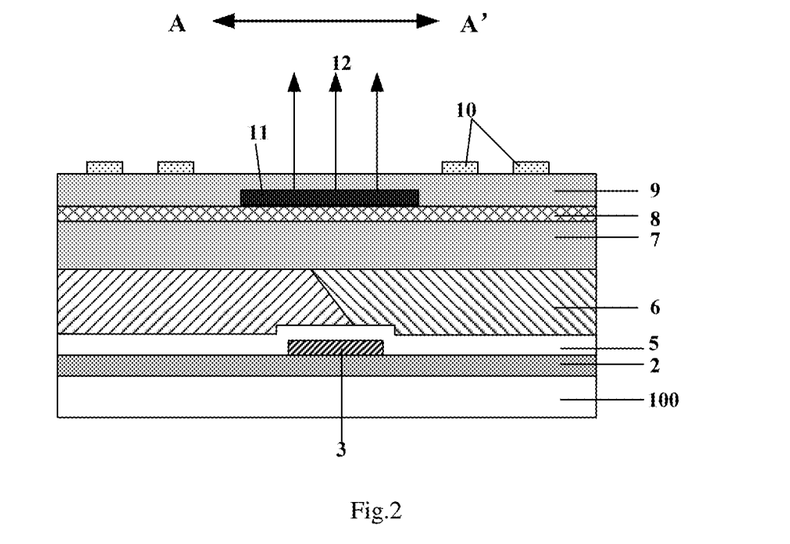
FIG. 2 is a sectional view of the COA array substrate along line A-A' in FIG. 1.
Figure 3:
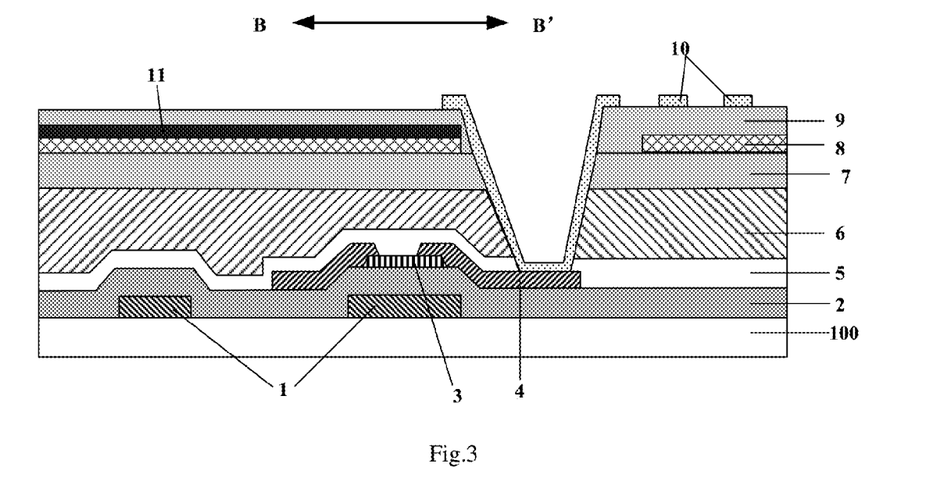
FIG. 3 is another sectional view of the COA array substrate along line B-B' in FIG. 1.
Figure 4:
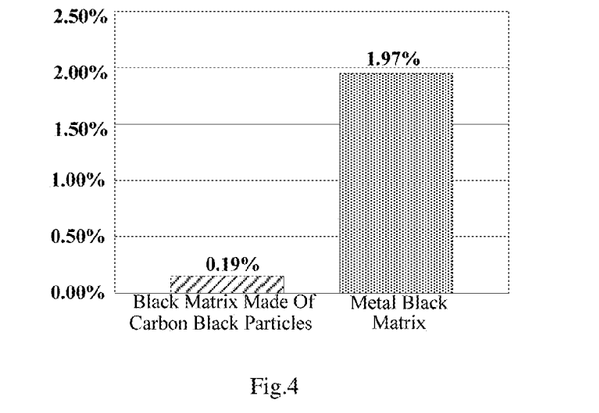
FIG. 4 is a schematic view showing reflectivity of display panels with different black matrices.

FIGS. 1-3 show a COA display substrate, and a black matrix may be made of organic resin and carbon black particles covering the organic resin. In order to increase an aperture ratio and reduce a parasitic capacitance, the black matrix may also be made of a metal material. However, when the metal material is adopted, light may be reflected by the metal black matrix in a display panel due to relatively high reflectivity of the metal material. As a result, the contrast will be degraded and the image quality will be adversely affected. Taking a 10.1-inch display panel as an example, as shown in FIG. 4, the reflectivity of the display panel including the black matrix made of a metal material is remarkably greater than that of the display panel including the black matrix made of carbon black particles. In addition, the reflectivity of the display panel is closely related to an area of the metal black matrix. The larger the area, the larger the reflectivity.

Figure 5:
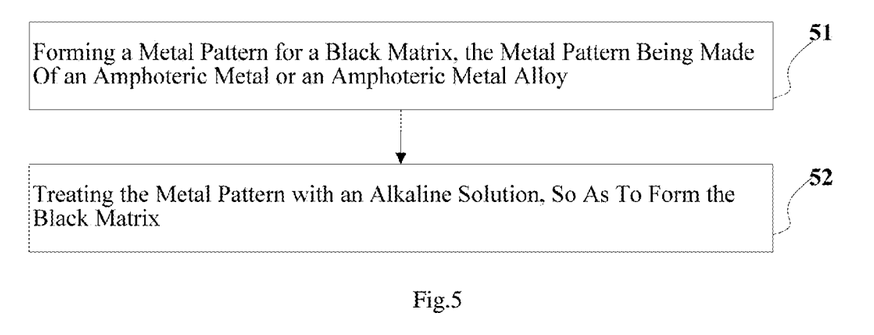
FIG. 5 is a flow chart of a step for forming a black matrix according to one embodiment of the present disclosure.

The present disclosure provides in some embodiments a method for manufacturing a display substrate, which includes a step of forming a black matrix. As shown in FIG. 5, the step of forming the black matrix includes: Step 51 of forming a metal pattern for the black matrix, the metal pattern being made of an amphoteric metal or an amphoteric metal alloy; and Step 52 of treating the metal pattern with an alkaline solution, so as to form the black matrix. A surface of the black matrix has a concave-convex microstructure.

According to the embodiments of the present disclosure, the black matrix is made of an amphoteric metal or amphoteric metal alloy, and then the surface of the metal black matrix is treated with the alkaline solution. Due to the reaction of the amphoteric metal with the alkaline solution, the surface of the metal black matrix may be corroded, so as to change the smooth surface with high reflectivity into a rough surface and reduce the reflectivity of the black matrix. As a result, it is able to reduce the reflectivity of the display panel with respect to the ambient light beam, thereby to increase the contrast and improve the image quality.

Alternatively, the amphoteric metal is aluminium, zinc or beryllium, and the amphoteric metal alloy is an alloy of two or more selected from the group consisting of aluminium, zinc and beryllium. The alkaline solution is a conventional alkaline solution, e.g., tetramethylammonium hydroxide (TMAH) or potassium hydroxide (KOH) solution, at a concentration of 0.01% to 5%. Further, the alkaline solution may be a KOH solution at a concentration of 0.04%.

Because aluminium, zinc or beryllium may be reacted with $OH^-$ in the alkaline solution, the surface of the black matrix may be corroded. Taking aluminium as an example, there are the following chemical reaction equations: $2Al+2OH^-+6H_2O=2Al(OH)_4^-+3H_2$, $2Al+2OH^-+2H_2O=2AlO_2^-+3H_2$, and $2Al+6OH^-+6H_2O=2Al(OH)_6^{3-}+3H_2$.

Alternatively, the display substrate is a COA substrate.

Figure 6:
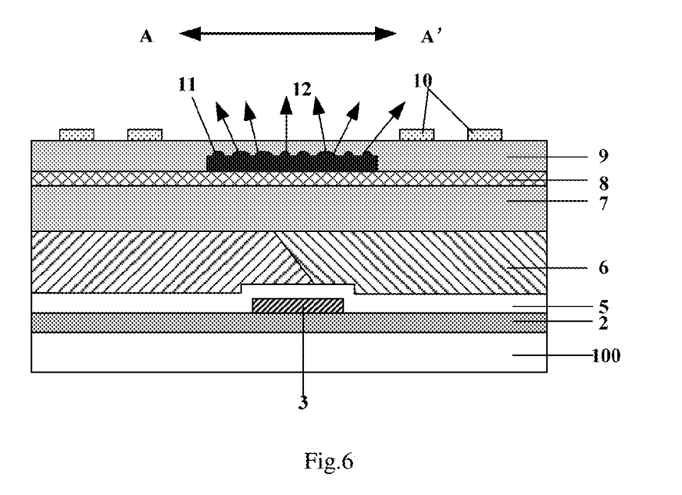
FIG. 6 is a sectional view of a COA array substrate along line A-A' according to one embodiment of the present disclosure.
Figure 7:
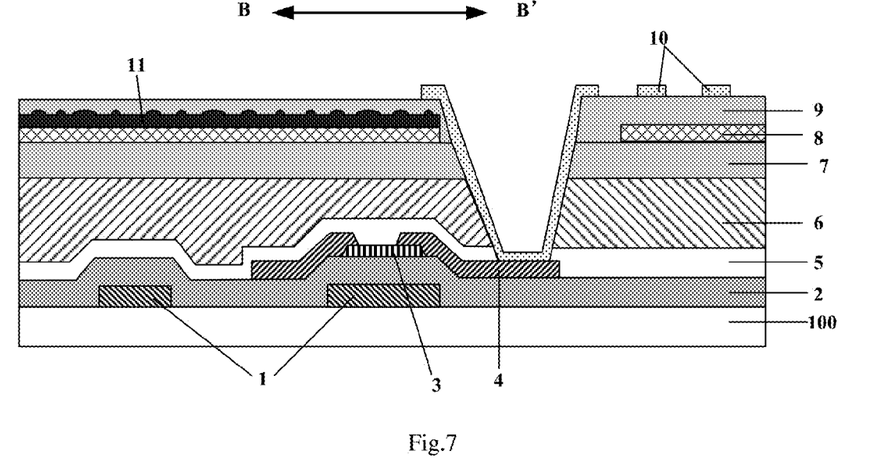
FIG. 7 is another sectional view of the COA array substrate along line B-B' according to one embodiment of the present disclosure.

The method for forming the COA substrate by using the above method is described hereinafter in details. FIGS. 6 and 7 are sectional views of the COA substrate along line A-A' and line B-B' respectively.

Step 61: forming a pattern of a gate metal layer including a gate electrode and a gate line 1. To be specific, a metal film having a thickness of 1000 Å to 4000 Å may be deposited onto a substrate 100, e.g., a glass substrate or a quartz substrate, by magnetron sputtering. Usually, the metal film may be made of molybdenum, aluminium, an aluminium-nickel alloy, a molybdenum-tungsten alloy, chromium or copper, or a combination thereof. A photoresist may be applied onto the metal film, exposed with a mask plate, and then developed, etched and removed, so as to form the pattern of the gate metal layer on the substrate 100.

Step 62: forming a gate insulation layer 2 on the gate metal layer. To be specific, a gate insulation layer having a thickness of 1000 Å to 6000 Å may be deposited onto the substrate 100 by chemical vapor deposition or magnetron sputtering. Usually, the gate insulation layer may be made of SiNx, SiOx or Si(ON)x.

Step 63: forming an active layer 3, a data line, a source electrode and a drain electrode 4 sequentially on the gate insulation layer 2. To be specific, a metal oxide semiconductor film may be deposited on the gate insulation layer 2 by chemical vapor deposition, and then patterned to form the active layer 3. In other words, a photoresist may be applied onto the metal oxide semiconductor film, exposed with a mask plate, and then developed and etched, so as to form the active layer 3. Further, a film made of a metal similar to a gate metal and having a thickness of 1000 Å to 4000 Å may be deposited onto the substrate, and then patterned, so as to form the data line, the source electrode and the drain electrode 4.

Step 64: forming a first passivation layer 5 covering the active layer 3, the data line, the source electrode and the drain electrode 4. To be specific, the first passivation layer 5 having a thickness of 1000 Å to 3000 Å may be applied onto the entire substrate. Usually, the first passivation layer 5 may be made of SiNx or a transparent organic resin material.

Step 65: forming red (R), green (G) and blue (B) color filters 6.

Step 66: subjecting the color filters 6 to planarization treatment with an organic film, and forming a pattern of the organic film 7 through a patterning process.

Step 67: depositing a transparent conductive film on a surface of the substrate obtained after Step 66, and forming a pattern of a common electrode 8 through a patterning process. To be specific, an ITO or IZO layer having a thickness of 300 Å to 500 Å may be deposited on the substrate by magnetron sputtering. A photoresist may be applied onto the ITO or IZO layer, and then exposed, developed and etched, so as to form the common electrode 8.

Step 68: depositing an amphoteric metal selected from the group consisting of aluminium, zinc and beryllium, or alloy thereof, onto the substrate obtained after Step 67. To be specific, a metal pattern having a thickness of 1000 Å to 4000 Å may be formed on the substrate through a patterning process, and then treated with a KOH solution at a concentration of 0.04%, so as to form a metal black matrix 11 with a rough surface. The amphoteric metal may be reacted with $OH^-$ in the alkaline solution, so the surface of the metal pattern may be corroded. As a result, it is able to change the smooth surface of the metal pattern having high reflectivity into a rough surface, thereby to reduce the reflectivity of the metal pattern.

Step 69: depositing a second passivation layer 9 onto the substrate obtained after Step 68, and forming a pattern of the second passivation layer 9 through a patterning process.

Step 70: depositing an ITO or IZO layer on the second passivation layer 9 by magnetron sputtering, and forming a pattern of a pixel electrode 10 through a patterning process.

Figure 8:
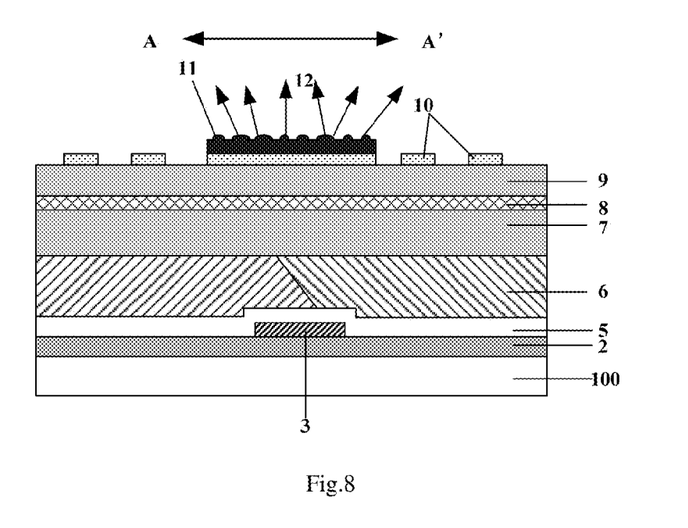
FIG. 8 is yet another sectional view of the COA array substrate along line A-A' according to one embodiment of the present disclosure.

Of course, Step 68 may also be performed subsequent to Step 70, i.e., the black matrix 11 may also be formed on the pixel electrode 10, as shown in FIG. 8.

In addition, the above-mentioned method may also be applicable to a display device in an In-Plane Switching (IPS), Twisted Nematic (TN) or Vertical Alignment (VA) mode where the black matrix is also made by a metal material.

During the manufacture, subsequent to the formation of the metal pattern for the black matrix, the metal pattern may be corroded with an alkaline solution separately, so as to form the black matrix 11 with a rough surface. However, in order to simplify the manufacture, alternatively, subsequent to the step of forming the metal pattern for the black matrix, the method may further includes: forming a first layer on the metal pattern, a first photoresist 13 on which has not been removed; removing the first photoresist 13, so as to remove a portion of the first layer on the first photoresist 13; and applying a second photoresist 14 on the remaining portion of the first layer, and exposing the second photoresist 14. Step 52 of treating the metal pattern with the alkaline solution so as to form the black matrix with the rough surface includes treating the metal pattern with an alkaline developing solution for developing the exposed second photoresist 14, so as to form the black matrix with the rough surface.

In the embodiments of the present disclosure, after the formation of the metal pattern for the black matrix, the first photoresist 13 on the metal pattern may not be removed, and the first layer may be formed continuously. Alternatively, the first layer is a transparent conductive layer for forming the pixel electrode 10 or the common electrode 8. After the formation of the first layer, the first photoresist 13 may be removed, so as to remove a portion of the first layer on the metal pattern. The second photoresist 14 may be applied onto the remaining portion of the first layer, and then exposed. The metal pattern may be treated with the alkaline developing solution for developing the exposed second photoresist 14, so as to form the metal black matrix 11 with a rough surface.

Figure 9:
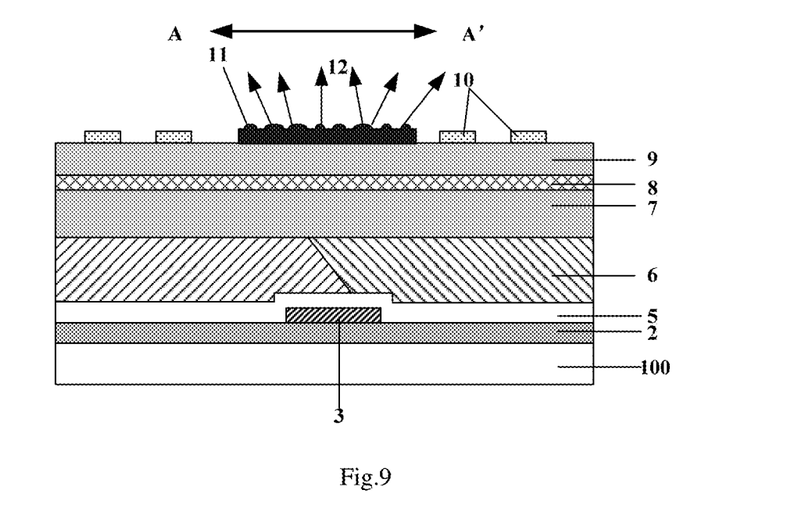
FIG. 9 is still yet another sectional view of the COA array substrate along line A-A' according to one embodiment of the present disclosure.
Figure 10:
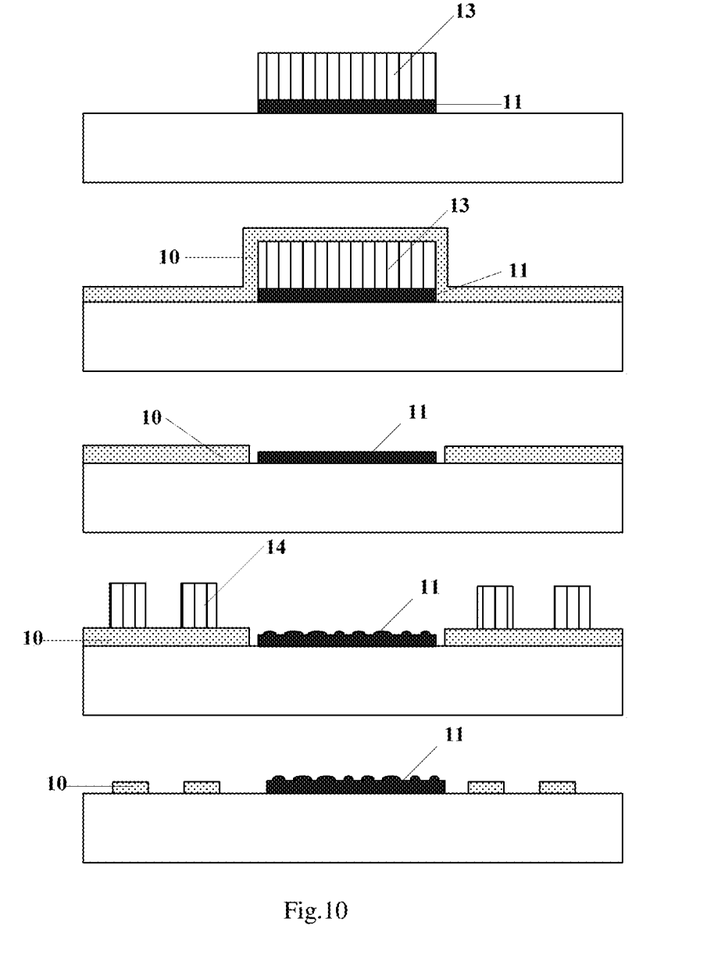
FIG. 10 is a schematic view showing the black matrix, a surface of which has a concave-convex microstructure, according to one embodiment of the present disclosure.

FIG. 9 is a sectional view of the COA substrate along line A-A' when the surface of the metal black matrix 11 is corroded with the developing solution for forming the pixel electrode 10. As shown in FIG. 10, the formation of the metal black matrix 11 and the pixel electrode 10 includes the following steps.

Step 101: depositing an amphoteric metal selected from the group consisting of aluminium, zinc and beryllium, or an alloy thereof, onto the substrate with the second passivation layer 9, and forming the metal pattern for the black matrix through a conventional patterning process. At this time, the first photoresist 13 on the metal pattern is not removed.

Step 102: depositing an ITO or IZO layer for forming the pixel electrode 10 on the first photoresist by magnetron sputtering.

Step 103: removing the first photoresist 13, and removing a portion of the pixel electrode 10 on the first photoresist 13.

Step 104: applying the second photoresist 14 onto the remaining portion of the pixel electrode 10, exposing the second photoresist 14, developing the exposed second photoresist 14 with an alkaline developing solution, e.g., a KOH solution at a concentration of 0.04%, and treating the metal pattern with the alkaline developing solution, so as to form the metal black matrix 11 with a rough surface.

Step 105: etching the ITO layer to form a pattern of the pixel electrode 10, and removing the second photoresist 14.

As mentioned above, the surface of the black matrix is not corroded immediately after the formation of the metal pattern for the black matrix, and instead, the black matrix is corroded and the photoresist is developed simultaneously with the alkaline developing solution for forming the pixel electrode 10. In other words, the black matrix 11 with a rough surface is arranged at a layer identical to the pixel electrode 10, and the corrosion of the surface of the black matrix 11 and the development of the pixel electrode 10 are performed simultaneously, so as to simply the manufacture process for the COA substrate.

The present disclosure further provides in some embodiments a display substrate manufactured by the above-men-

What is claimed is:

1. A method for manufacturing a display substrate, comprising a step of forming a black matrix, wherein the step of forming the black matrix comprises:
   forming a metal pattern for the black matrix, the metal pattern being made of an amphoteric metal or an amphoteric metal alloy; and
   treating the metal pattern with an alkaline solution, so as to form the black matrix, wherein a surface of the black matrix has a concave-convex microstructure.

2. The method according to claim 1, wherein the amphoteric metal is aluminium, zinc or beryllium.

3. The method according to claim 1, wherein the alkaline solution is tetramethylammonium hydroxide (TMAH) or potassium hydroxide (KOH) solution at a concentration of 0.01% to 5%.

4. The method according to claim 3, wherein the alkaline solution is a KOH solution at a concentration of 0.04%.

5. The method according to claim 1, wherein subsequent to the step of forming the metal pattern for the black matrix, the method further comprising:
   forming a first layer on the metal pattern, a first photoresist on which has not been removed;
   removing the first photoresist, so as to remove a portion of the first layer on the first photoresist; and
   applying a second photoresist on the remaining portion of the first layer, and exposing the second photoresist, and the step of treating the metal pattern with an alkaline solution so as to form the black matrix comprises:
   treating the metal pattern with an alkaline developing solution for developing the exposed second photoresist, so as to form the black matrix, wherein the surface of the black matrix has a concave-convex microstructure.

6. The method according to claim 1, wherein the display substrate is a color filter on array (COA) substrate.

7. The method according to claim 5, wherein the first layer is a transparent conductive layer for forming a pixel electrode or a common electrode.

8. The method according to claim 5, wherein the first layer is made of indium tin oxide (ITO) or indium zinc oxide (IZO).

9. The method according to claim 1, further comprising:
   forming a pattern of a gate metal layer including a gate electrode and a gate line;
   forming a gate insulation layer on the gate metal layer;
   forming an active layer, a data line, a source electrode and a drain electrode sequentially on the gate insulation layer;
   forming a first passivation layer covering the active layer, the data line, the source electrode and the drain electrode;
   forming a color filter;
   subjecting the color filter to planarization treatment with an organic film, and forming a pattern of the organic film through a patterning process;
   depositing a transparent conductive film and forming a pattern of the common electrode through a patterning process;
   depositing a second passivation layer, and forming a pattern of the second passivation layer through a patterning process; and
   depositing an ITO or IZO layer on the second passivation layer by magnetron sputtering, and forming a pattern of the pixel electrode through a patterning process.

10. The method according to claim 9, wherein
   the step of forming the black matrix is performed subsequent to the step of depositing the transparent conductive film and forming the pattern of the common electrode through a patterning process, and prior to the step of depositing the second passivation layer, or
   the step of forming the black matrix is performed subsequent to the step of forming the pattern of the pixel electrode.

* * * * *